(12) United States Patent
Min

(10) Patent No.: US 7,843,018 B2
(45) Date of Patent: Nov. 30, 2010

(54) TRANSISTOR PROVIDING DIFFERENT THRESHOLD VOLTAGES AND METHOD OF FABRICATION THEREOF

(75) Inventor: Sung-Ki Min, Cupertino, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 12/363,796

(22) Filed: Feb. 2, 2009

(65) Prior Publication Data

US 2009/0134475 A1 May 28, 2009

Related U.S. Application Data

(62) Division of application No. 11/743,973, filed on May 3, 2007, now Pat. No. 7,645,662.

(51) Int. Cl.
*H01L 29/00* (2006.01)

(52) U.S. Cl. .............................. 257/402; 257/E29.005; 257/E29.109

(58) Field of Classification Search ................ 257/402, 257/403, 404, E29.005, E29.006, E29.109
See application file for complete search history.

(56) References Cited

U.S. PATENT DOCUMENTS

| 5,422,510 | A | 6/1995 | Scharf et al. ................. 257/401 |
| 5,478,763 | A | 12/1995 | Hong ........................... 437/35 |
| 6,461,920 | B1* | 10/2002 | Shirahata et al. ............. 438/276 |
| 6,482,724 | B1* | 11/2002 | Chatterjee .................... 438/525 |
| 6,873,008 | B2* | 3/2005 | Houston et al. .............. 257/327 |
| 2002/0074612 | A1 | 6/2002 | Bulucea et al. .............. 257/402 |
| 2003/0020125 | A1 | 1/2003 | Mandelman et al. ........ 257/408 |
| 2003/0100150 | A1 | 5/2003 | Kitakado et al. ............. 438/151 |
| 2003/0119248 | A1 | 6/2003 | Mistry et al. ................. 438/217 |
| 2003/0122132 | A1 | 7/2003 | Yamazaki ..................... 257/72 |
| 2004/0007748 | A1 | 1/2004 | Sakama et al. ............... 257/410 |
| 2004/0051138 | A1* | 3/2004 | Jang ........................... 257/345 |
| 2004/0053456 | A1 | 3/2004 | Jang ........................... 438/197 |
| 2005/0189543 | A1 | 9/2005 | Yamazaki et al. ............. 257/72 |
| 2005/0263835 | A1 | 12/2005 | Sakama et al. .............. 257/411 |

(Continued)

FOREIGN PATENT DOCUMENTS

JP 05-218411 8/1993

(Continued)

OTHER PUBLICATIONS

*USPTO; Office Action* for U.S. Appl. No. 11/743,973, filed May 3, 2007 in the name of Sung-Ki Min; 11 pages, Jun. 11, 2009.

(Continued)

*Primary Examiner*—Victor A Mandala
*Assistant Examiner*—Scott Stowe
(74) *Attorney, Agent, or Firm*—Baker Botts L.L.P.

(57) ABSTRACT

A transistor includes a channel region with a first portion and a second portion. A length of the first portion is smaller than a length of the second portion. The first portion has a higher threshold voltage than the second portion. The lower threshold voltage of the second portion allows for an increased ON current. Despite the increase attained in the ON current, the higher threshold voltage of the first portion maintains or lowers a relatively low OFF current for the transistor.

19 Claims, 3 Drawing Sheets

U.S. PATENT DOCUMENTS

2006/0208258 A1  9/2006  Yamazaki ................... 257/66

FOREIGN PATENT DOCUMENTS

| JP | 05-235342 | 9/1993 |
| --- | --- | --- |
| JP | 10-056169 | 2/1998 |
| JP | 11-214686 | 8/1999 |

OTHER PUBLICATIONS

USPTO; *Notice of Allowance and Fee(s) Due* for U.S. Appl. No. 11/743,973, filed May 3, 2007 in the name of Sung-Ki Mim; 8 pages, Sep. 23, 2009.

USPTO; *Office Action* for U.S. Appl. No. 11/743,973, filed May 3, 2007 in the name of Sung-Ki Min; 13 pages, Jan. 12, 2009.

A. Chatterjee, et al.; *Pass Transistor Designs Using Pocket Implant to Improve Manufacturability for 256Mbit DRAM and Beyond*; IEEE; XP-10131942; 4 pages, 1994.

*PCT Notification of Transmittal of the International Search Report and the Written Opinion of the International Searching Authority* for International Application No. PCT/US2008/060980; 11 pages, Jul. 3, 2008.

\* cited by examiner

TRANSISTOR PROVIDING DIFFERENT THRESHOLD VOLTAGES AND METHOD OF FABRICATION THEREOF

CROSS-REFERENCE TO RELATED APPLICATION

This application is a divisional of U.S. application Ser. No. 11/743,973 filed May 3, 2007 and entitled "Transistor Providing Different Threshold Voltages and Method of Fabrication Thereof".

TECHNICAL FIELD

The present invention relates in general to semiconductor devices and fabrication and more particularly to a transistor providing different threshold voltages and method of fabrication thereof.

BACKGROUND

The threshold voltage of a transistor has an effect on the ON current and the OFF leakage current for the transistor. Typically for low voltage applications, it is desirable to have a relatively high ON current. The ON current is affected in simplified terms by a scale factor of $(V_{gs}-V_{th})^m$ where $V_{gs}$ is the gate to source voltage, $V_{th}$ is the threshold voltage, and m is an exponent between 1 and 2. $V_{gs}$ typically can be the supply voltage. The ON current can be increased by lowering the threshold voltage. However, it is also desirable to have a relatively low OFF leakage current. Lowering the threshold voltage causes an increase in the OFF leakage current. The OFF leakage current is affected in simplified terms by a scale factor of $10^{(V_{gs}-B_{th})/S}$ where S is the subthreshold slope $V_{th} \times \ln 10$. In this case, $V_{gs}$ typically can be the voltage of the source. Thus, a change in the threshold voltage causes a desirable change in scale for the ON current but an undesirable change in scale for the OFF leakage current of the transistor and vice versa.

SUMMARY

From the foregoing, it may be appreciated by those skilled in the art that a need has arisen for maintaining or increasing the ON current of a transistor without also increasing the OFF current of the transistor. In accordance with the present invention, a transistor providing different threshold voltages and method of fabrication thereof are provided that substantially eliminate or greatly reduce disadvantages and problems found in conventional transistor designs.

According to an embodiment of the present invention, there is provided a transistor that includes a channel region with a first portion and a second portion. A length of the second portion can be smaller than a length of the first portion. The second portion has a higher threshold voltage than the first portion. The lower threshold voltage of the first portion allows for an increased ON current. Despite the increase attained in the ON current, the higher threshold voltage of the second portion maintains a relatively low OFF current for the transistor.

The present invention provides various technical advantages over conventional transistor designs. Some of these technical advantages are shown and described in the description of the present invention. Certain embodiments of the present invention may enjoy some, all, or none of these advantages. Other technical advantages may be readily apparent to one skilled in the art from the following figures, description, and claims.

BRIEF DESCRIPTION OF THE DRAWINGS

For a more complete understanding of the present invention and the advantages thereof, reference is made to the following description taken in conjunction with the accompanying drawings, wherein like reference numerals represent like parts, in which.

DETAILED DESCRIPTION

Figure 1A:
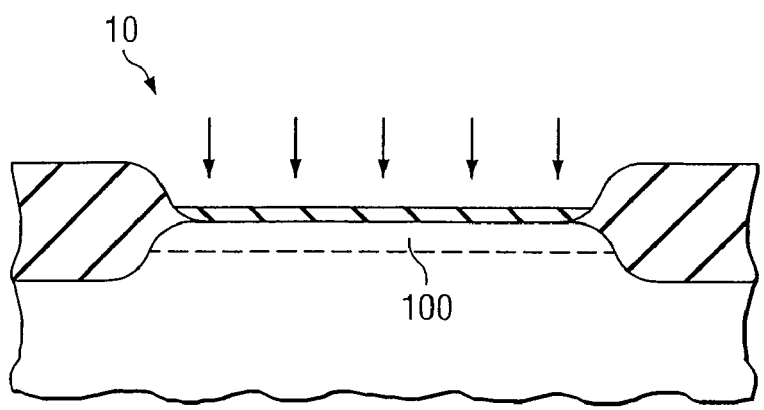
FIGS. 1A-1C illustrate a process for fabricating an embodiment of a channel region of a transistor.
Figure 1B:
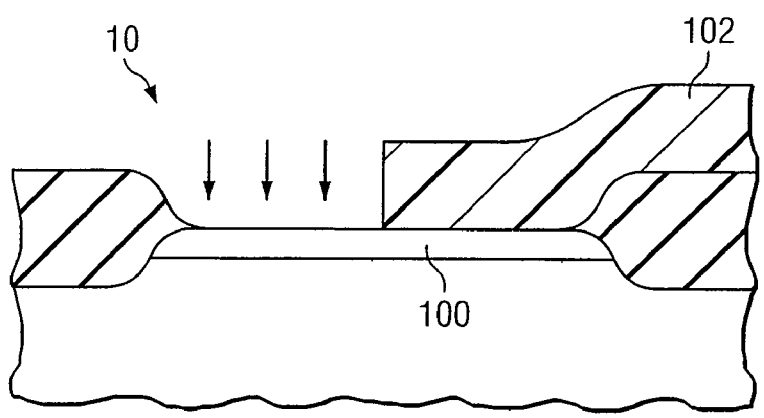
Figure 1C:
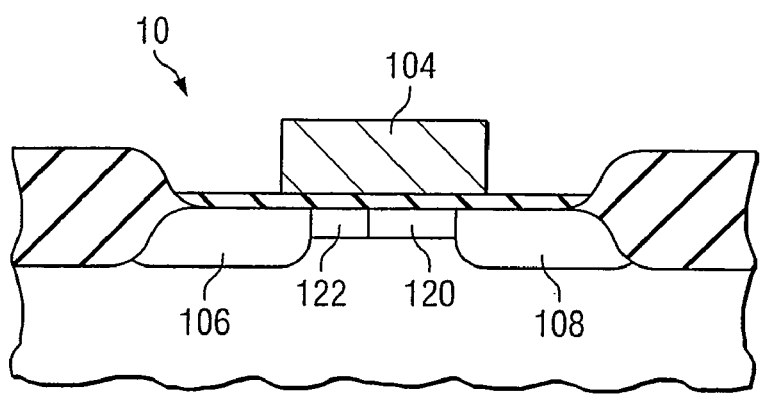

FIGS. 1A-1C show a process for fabricating an embodiment of a channel region 100 of a transistor 10. In FIG. 1A, channel region 100 is implanted with a dopant selected to provide a relatively low threshold voltage for transistor 10. In FIG. 1B, a photoresist mask 102 is formed over channel region 100 to establish a first portion 120 and leave a second portion 122 exposed. The second portion 122 of channel region 100 is implanted with a dopant selected to provide a relatively high threshold voltage. In FIG. 1C, a finished channel region 100 is shown with first portion 120 and second portion 122. The remainder of transistor 10 to include a gate region 104, a source region 106, and a drain region 108 can be formed in a conventional manner.

Figure 2A:
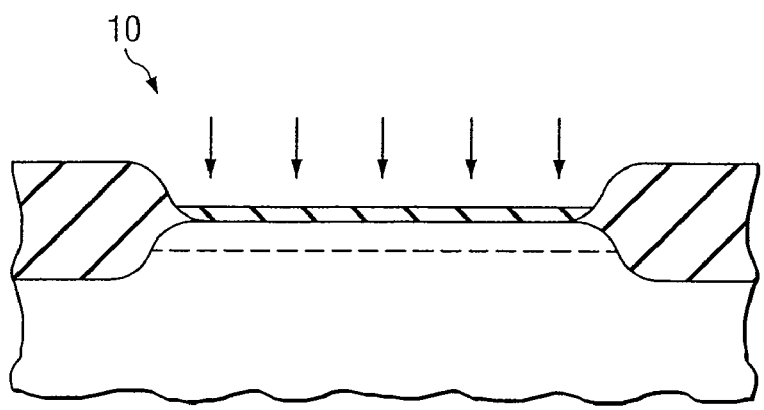
FIGS. 2A-2C illustrate an alternative process for fabricating an embodiment of a channel region of the transistor.
Figure 2B:
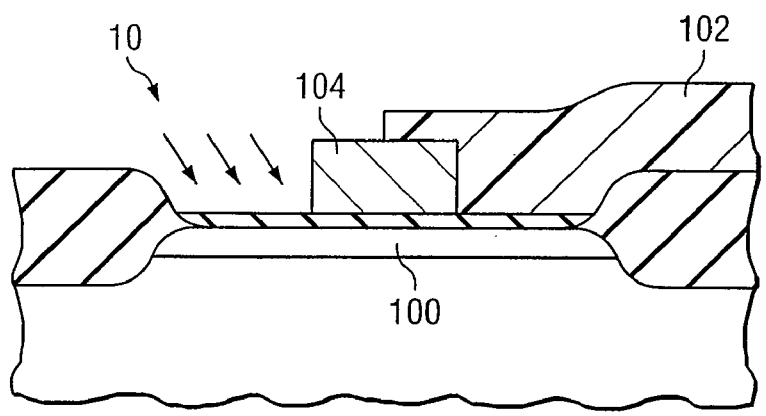
Figure 2C:
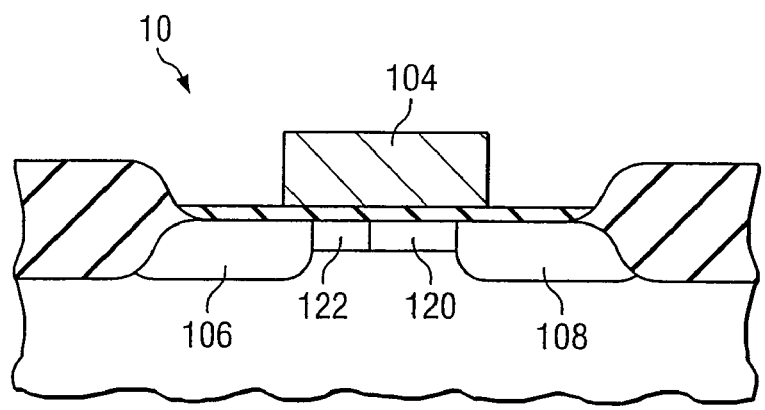

FIGS. 2A-2C show an alternative process for fabricating an embodiment of channel region 100 of transistor 10. In FIG. 2A, channel region 100 is implanted with a first dopant selected to provide a relatively low threshold voltage for transistor 10. In FIG. 2B, a gate region 104 is formed over channel region 100. A photoresist mask 102 is formed over channel region 100 and gate region 104 to establish a first portion 120 and leave a second portion 122 exposed. The second portion 122 of channel region 100 is implanted with a second dopant selected to provide a relatively high threshold voltage. The implanting of the second dopant may be performed at an angle relative to transistor 10 to assist in establishing second portion 122 and first portion 120. In FIG. 2C, a finished channel region 100 is shown with first portion 120 and second portion 122. The remainder of transistor 10 to include gate region 104, source region 106, and drain region 106 can be formed in a conventional manner.

In one embodiment, second portion 122 is shown in closer proximity to source region 106 of transistor 10 than first portion 120. Though shown in this manner, transistor 10 can also be fabricated with second portion 122 being in closer proximity to drain region 108 than first portion 120.

Figure 3:
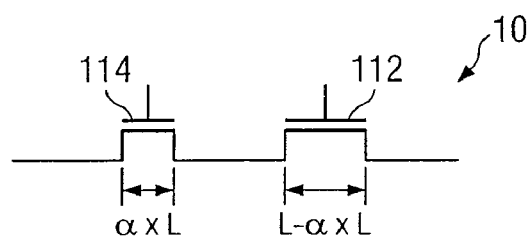
FIG. 3 shows a schematic circuit diagram for the transistor.

FIG. 3 shows a schematic circuit diagram of transistor 10. By establishing first portion 120 and second portion 122 within channel region 100, transistor 10 logically becomes a dual transistor device with a lower threshold voltage transistor 112 serially connected with a higher threshold voltage transistor 114. The total length of channel region 100 is similar to channel lengths of conventional transistors. Higher threshold voltage transistor 114 has a channel length of $\alpha \times L$, where L is the total channel length of channel region 100 and a is a fraction less than one. Lower threshold voltage transistor 112 has a channel length of $L-(\alpha \times L)$. By optimizing $\alpha$ to be a small fraction (such as approximately 0.1 to 0.15), the ON current can mainly be determined by lower threshold voltage transistor 112 having a longer channel length and the OFF current can mainly be determined by higher threshold voltage transistor 114 having the shorter channel length.

Higher threshold voltage transistor 114 reduces leakage current exponentially as the threshold voltage is increased. However, this has a minimal affect on the ON current of transistor 10 because the ON current is a quadrature or linear function of threshold voltage as well as from higher threshold transistor 114 having a smaller channel length. The increase resistance provided by higher threshold transistor 114 enables the threshold voltage of lower threshold transistor 112 to become even lower and still maintain a lower OFF current than a traditional transistor design with a uniform channel region. Thereby, the ON current can be further increased. In addition, the OFF leakage current from lower threshold voltage transistor 112 is essentially blocked by higher threshold voltage transistor 114. In essence, higher threshold voltage transistor 114 acts somewhat as an insulator in the OFF state to absorb the leakage current flowing through lower threshold voltage transistor 112. If maintaining low leakage current is of primary interest, then a can be larger (e.g., greater than 0.5).

Figure 4:
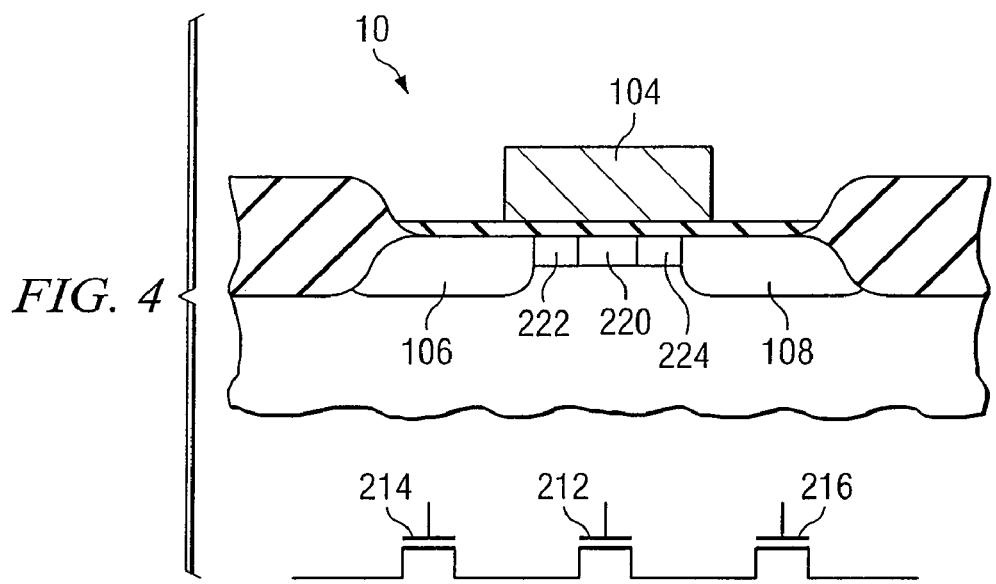
FIG. 4 shows an alternative embodiment for the channel region.

FIG. 4 shows an alternate embodiment of channel region 100 of transistor 10. Though shown in FIG. 3 as having higher threshold voltage transistor 114 in series with lower threshold voltage transistor 112, channel region 100 may be implanted in a manner to provide any number of transistors within physical transistor 10. For example, channel region 100 may have a first portion 220, a second portion 222, and a third portion 224. Second portion 222 may establish a lower threshold voltage transistor 212. First portion 220 and third portion 224 may establish higher threshold transistors 214 and 216. First portion 220 and third portion 224 may be of equal or different lengths. Similarly, second portion 222 may establish a higher threshold voltage transistor 212. First portion 220 and third portion 224 may establish lower threshold transistors 214 and 216. In essence, this is an extension of the configuration discussed above with reference to FIGS. 1A-1C and 2A-2C, where second portion 122 can be formed to separate first portion 120 into two sub-portions with each sub-portion having a similar doping profile or further processed to have different doping profiles. Further, second portion 122 may be positioned such that each sub-portion may have similar or different lengths.

Figure 5:
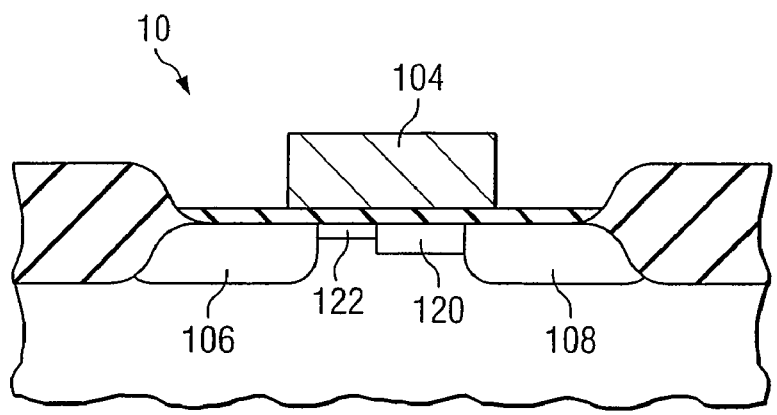
FIG. 5 shows an alternative embodiment for the channel region.

FIG. 5 shows an alternative embodiment of channel region 100 of transistor 10. In this embodiment, second portion 122 has a lesser depth than first portion 120. Second portion 122 may be implanted to provide a relatively higher threshold voltage. Second portion 122 may also be formed to include a relatively same number of dopants as it would have if it were fabricated with the same depth as first portion 120. The amount of dopant in second portion 122 is merely confined to a smaller area, resulting in higher dopant concentration. This provides an advantage when the drain voltage of second portion 122 becomes higher. Without this embodiment, the higher drain voltage will cause more DIBL (Drain Induced Barrier Lowering) and CLM (Channel Length Modulation) effects.

By selecting dopants to establish different threshold voltages in transistor 10, the ON current for transistor 10 can be increased without causing a corresponding increase in the OFF leakage current of transistor 10. In one example embodiment having a 100 nm length for second portion 122 and an 800 nm length for first portion 120 providing a 900 nm length for channel region 100, second portion 122 can provide a 150 mV higher threshold voltage and first portion 120 can provide a 150 mV lower threshold voltage than a single dopant implanted channel region. The OFF leakage current may be reduced by a factor of five with a corresponding 35% increase in ON current. Moreover, this technique can be applicable for any type of transistor, including junction field effect and metal oxide semiconductor field effect transistor designs.

Thus, it is apparent that there has been provided, in accordance with the present invention, a transistor with dual threshold voltages and method of fabrication thereof that satisfies the advantages set forth above. Although the present invention has been described in detail, various changes, substitutions, and alterations may be readily ascertainable by those skilled in the art and may be made herein without departing from the spirit and scope of the present invention as set out in the appended claims. Moreover, the present invention is not intended to be limited in any way by any statement made herein that is not otherwise reflected in the following claims.

What is claimed is:

1. A transistor, comprising:
a source region formed in a semiconductor substrate;
a drain region formed in the semiconductor substrate and spaced apart from the source region; and
a channel region formed in the semiconductor substrate between the source region and the drain region, the channel region having a first portion with a first depth and a second portion with a second depth different than the first depth, wherein the first portion has an amount of dopant at the first depth and the second portion has approximately the same amount of the dopant at the second depth such that the second portion has a different threshold voltage than the first portion.

2. The transistor of claim 1, wherein the second portion provides a higher threshold voltage than the first portion.

3. The transistor of claim 1, wherein the first portion has a first length and the second portion has a second length, the second length being smaller than the first length.

4. The transistor of claim 3, wherein the second length is determined by an equation $\alpha \times L$ and the first length is determined by an equation $L-(\alpha \times L)$, where L is a length of the channel region and a is a fraction less than one.

5. The transistor of claim 1, wherein the second portion is in closer proximity to the source region of the transistor than the first portion.

6. The transistor of claim 1, wherein the second portion has a lesser depth than the first portion.

7. The transistor of claim 1, wherein the channel region has a third portion, the third portion providing a different threshold voltage than the first portion.

8. The transistor of claim 7, wherein the first portion separates the second portion from the third portion.

9. A transistor, comprising:
a source region formed in a semiconductor substrate;
a drain region formed in the semiconductor substrate and spaced apart from the source region; and
a channel region formed in the semiconductor substrate between the source region and the drain region, the channel region having a first portion with a first depth and a second portion with a second depth different than the first depth, wherein:
the first portion has an amount of dopant at the first depth and the second portion has approximately the same amount of the dopant at the second depth;
the second portion has a higher threshold voltage than the first portion; and
the second portion has a smaller length than the first portion.

10. The transistor of claim 9, wherein the length of the second portion is determined by an equation $\alpha \times L$ and the length of the first portion is determined by an equation $L-(\alpha \times L)$, where L is a length of the channel region and a is a fraction less than one.

11. The transistor of claim 9, wherein the second portion is in closer proximity to the source region of the transistor than the first portion.

12. The transistor of claim 9, wherein the second portion has a lesser depth than the first portion.

13. The transistor of claim 9, wherein the channel region has a third portion, the third portion providing a higher threshold voltage than the first portion.

14. The transistor of claim 13, wherein the first portion separates the second portion from the third portion.

15. A transistor, comprising:
a source region formed in a semiconductor substrate;
a drain region formed in the semiconductor substrate and spaced apart from the source region; and
a channel region formed in the semiconductor substrate between the source region and the drain region, the channel region having a first portion with a first depth, a second portion with a second depth different than the first depth, and a third portion, wherein the first portion has an amount of dopant at the first depth and the second portion has approximately the same amount of the dopant at the second depth, and the first portion has a different threshold voltage than the second portion and the third portion.

16. The transistor of claim 15, wherein the first portion separates the second portion from the third portion.

17. The transistor of claim 15, wherein the first portion provides a lower threshold voltage than the second portion and the third portion.

18. The transistor of claim 15, wherein:
the first portion has a first length;
the second portion has a second length;
the third portion has a third length; and
the second length and the third length are smaller than the first length.

19. The transistor of claim 15, wherein the second portion has a lesser depth than the first portion.

* * * * *